(12) United States Patent
Toda et al.

(10) Patent No.: US 6,449,212 B1
(45) Date of Patent: Sep. 10, 2002

(54) ANALOG SYNCHRONIZATION CIRCUIT FOR SYNCHRONIZING EXTERNAL AND INTERNAL CLOCK SIGNALS

(75) Inventors: Haruki Toda; Hironobu Akita, both of Yokohama; Katsuaki Isobe, Kawasaki, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 96 days.

(21) Appl. No.: 09/628,449

(22) Filed: Jul. 28, 2000

(30) Foreign Application Priority Data

Aug. 12, 2000 (JP) .......................................... 11-228710

(51) Int. Cl.⁷ ................................................ G11C 8/00
(52) U.S. Cl. ................... 365/233; 365/194; 365/189.07
(58) Field of Search ........................... 365/233, 189.07, 365/194

(56) References Cited

U.S. PATENT DOCUMENTS

| 5,440,515 A | * | 8/1995 | Chang et al. | ................ 365/194 |
| 5,610,543 A | * | 3/1997 | Chang et al. | ................ 327/158 |
| 5,731,727 A | * | 3/1998 | Iwamoto et al. | ............ 327/281 |
| 5,867,432 A | | 2/1999 | Toda | ........................ 365/194 |
| 5,886,946 A | * | 3/1999 | Ooishi | ........................ 365/233 |
| 5,963,502 A | * | 10/1999 | Watanabe et al. | ........... 365/233 |
| 5,986,949 A | | 11/1999 | Toda | ........................ 365/194 |

FOREIGN PATENT DOCUMENTS

JP            3-125516           5/1991

OTHER PUBLICATIONS

Takanori Saeki, et al., "A 2.5ns Clock Access 250MHz 256Mb SDRAM with a Synchronous Mirror Delay", ISSCC Digest of Technical Papers, pp. 374–375, Feb. 1996.
Daeyum Shim, et al., "An Analog Synchronous Mirror Delay for High–Speed DRAM Application", IEEE Journal of Solid–State Circuits, vol. 34, No. 4, pp. 484–493, Apr. 1999.

* cited by examiner

*Primary Examiner*—Richard Elms
*Assistant Examiner*—Tuan T. Nguyen
(74) *Attorney, Agent, or Firm*—Banner & Witcoff, Ltd.

(57) ABSTRACT

A first capacitor is charged by a constant current source circuit for a time corresponding to the delay time of forward pulses. A second capacitor is charged by a constant current source circuit. A comparator compares the voltages of the first and second capacitors, and outputs a timing signal when these voltages match. For this reason, a timing at which the second capacitor has been charged for a time corresponding to the delay time of backward pulses can be obtained.

24 Claims, 13 Drawing Sheets

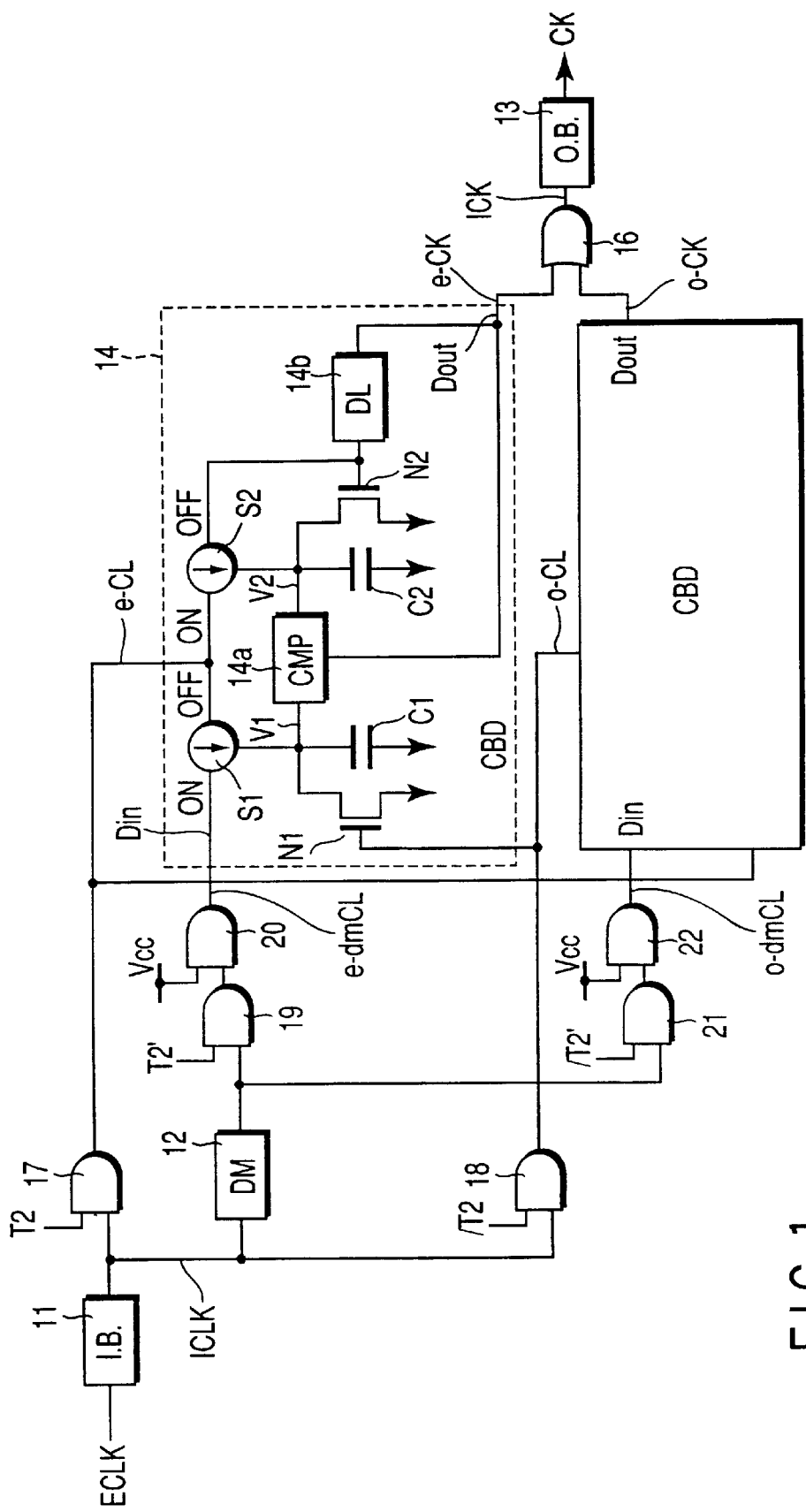
F I G. 1

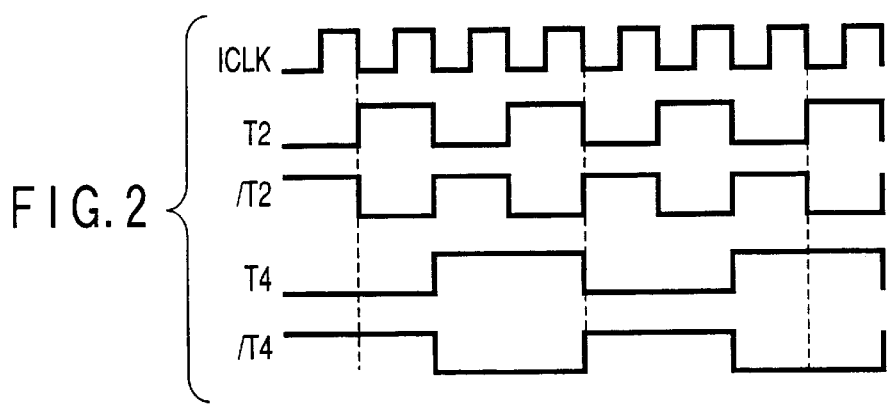
F I G. 2
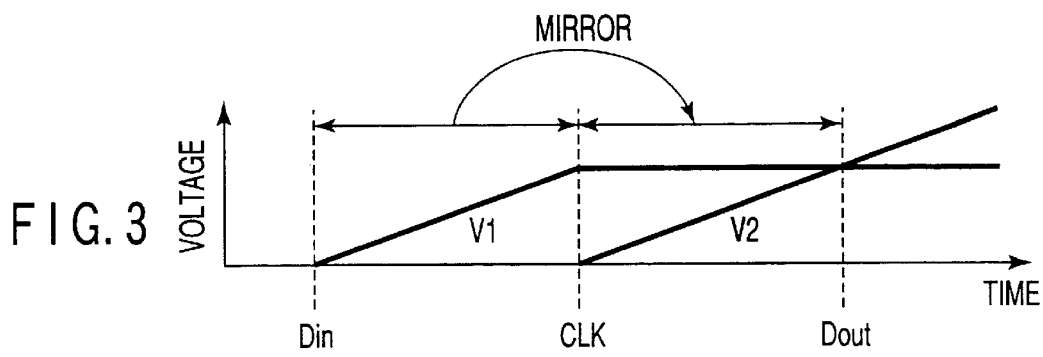
F I G. 3
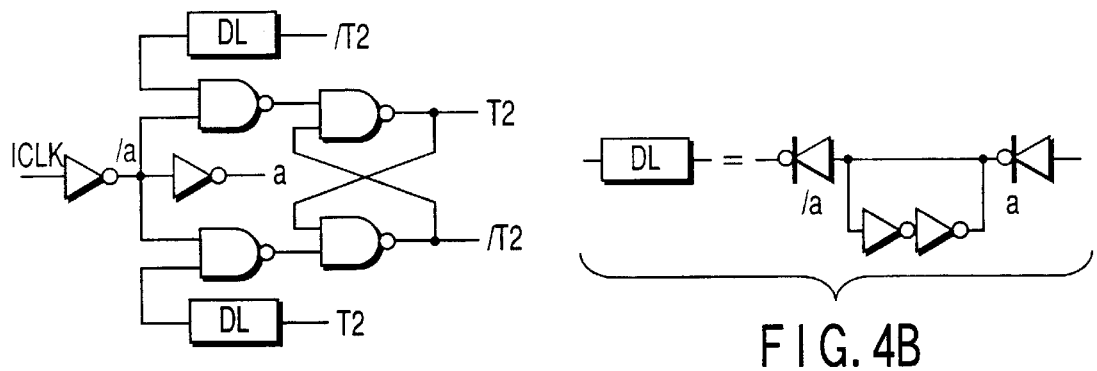
F I G. 4A
F I G. 4B
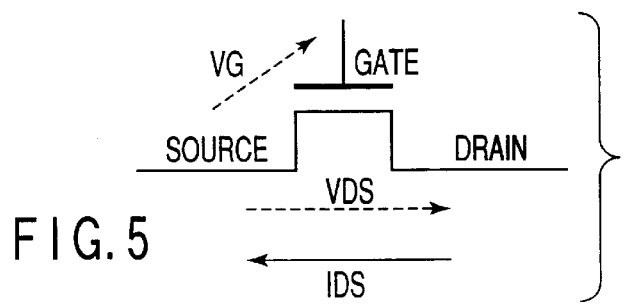
F I G. 5

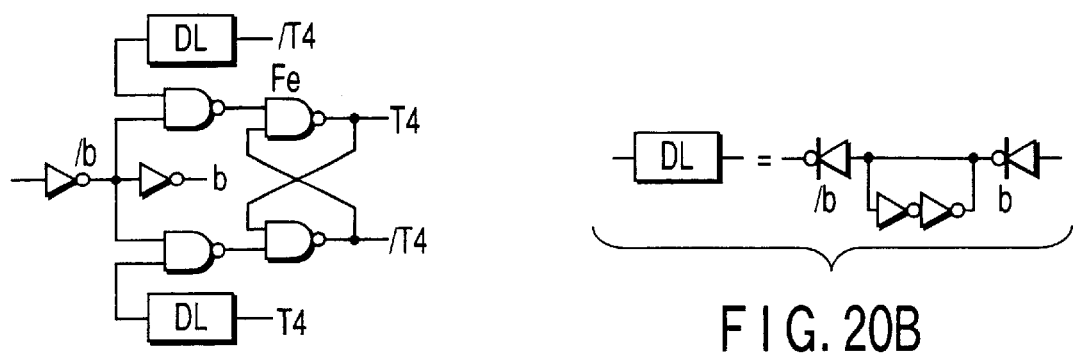
FIG. 20A
FIG. 20B
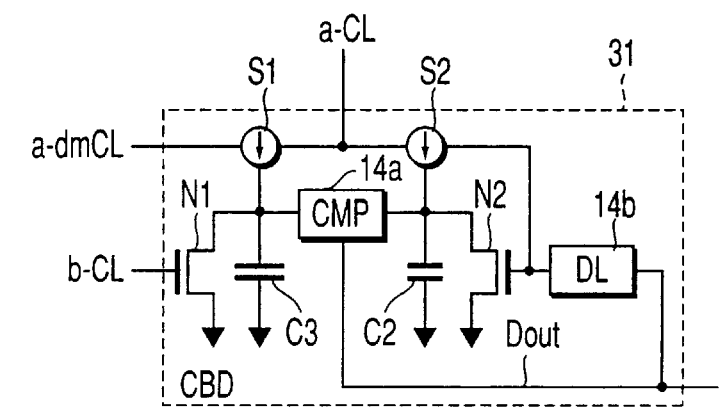
FIG. 21
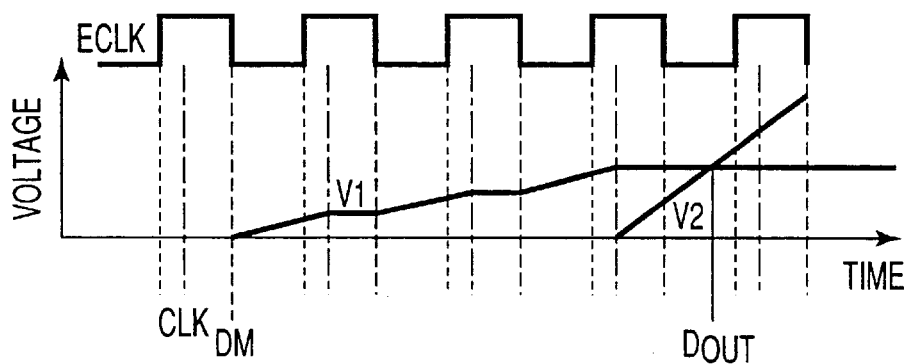
FIG. 22

PRIOR ART
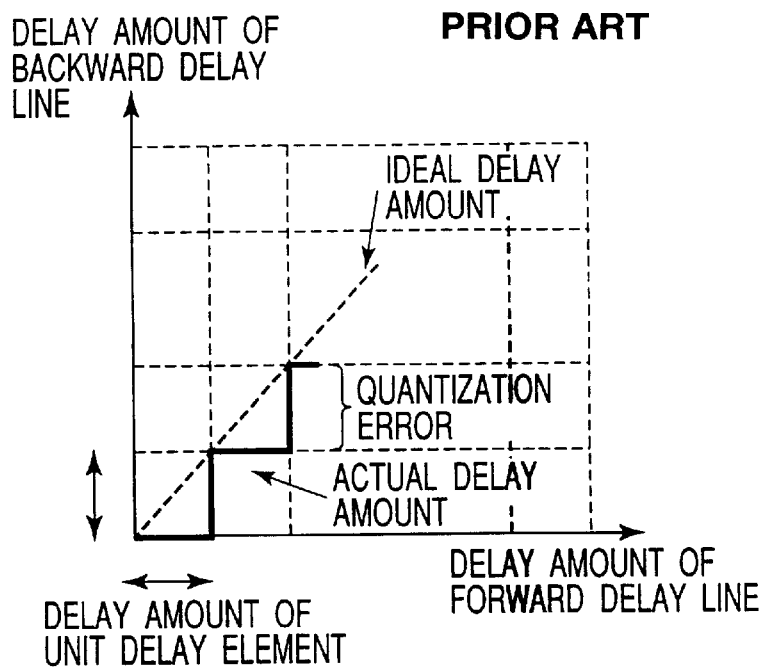
F I G. 28

ANALOG SYNCHRONIZATION CIRCUIT FOR SYNCHRONIZING EXTERNAL AND INTERNAL CLOCK SIGNALS

CROSS-REFERENCE TO RELATED APPLICATIONS

This application is based upon and claims the benefit of priority from the prior Japanese Patent Application No. 11-228710, Aug. 12, 1999, the entire contents of which are incorporated herein by reference.

BACKGROUND OF THE INVENTION

The present invention relates to an analog synchronization circuit applied to a semiconductor storage device such as a synchronous DRAM or the like.

In a semiconductor storage device of this type, an internal clock signal generated inside the chip must be synchronized with an external clock signal supplied from a circuit outside the chip. In the chip, when an external clock signal is received by an input buffer, and the external clock signal, output from the input buffer is distributed inside the chip, the clock signals inside and outside the chip have different phases due to input buffer and line delays. To avoid such phase difference, various synchronization circuits for synchronizing external and internal clock signals have been developed.

As such synchronization circuits, for example, a mirror type DLL (DLL; Delay Locked Loop) including an SMD (Synchronous Mirror Delay) used in T. Saeki, et al. "A 2.5 ns Clock Access 250 MHz 256 Mb SDRAM with a Synchronous Mirror Delay", ISSCC Digest of Technical Papers, pp. 374–375, Feb., 1996, an STBD (Synchronous Traced Backward Delay) described in U.S Pat. No. 5,867,432, and the like is known. The mirror type DLL has high synchronization speed, and can generate an internal clock signal which is synchronized with an external clock signal from the third clock of the external clock signal.

FIG. 27 shows an example of a conventional mirror type DLL. This mirror type DLL comprises an input buffer (I.B.), output buffer (O.B.), delay monitor (DM), and delay line (DL). The delay monitor (DM) is comprised of a replica circuit of an input buffer (I.B.) and output buffer (O.B.), and monitors their delay times. The delay line (DL) comprises a forward delay line DL1 and backward delay line DL2. In this delay line (DL), the backward delay line attains synchronization by a mirror operation for delaying backward pulses by the same delay time as that of a forward pulse signal supplied to the forward delay line. For this reason, precision of making the delay times of the two delay lines equal to each other is a factor that largely determines synchronization precision.

The conventional delay line (DL) is constructed by connecting a plurality of logic gates such as inverter circuits and the like in series with each other. The delay time of the delay line is determined by the number of logic gate stages of the backward delay line DL2 that the backward pulses pass through on the basis of information indicating the number of logic gate stages of the forward delay line DL1 that the forward pulses pass through. In this manner, the delay time is defined by a quantized value, i.e., the number of logic gate stages.

For this reason, as shown in FIG. 28, the delay amount in the forward delay line does not equal that in the backward delay line, thus producing quantization errors.

BRIEF SUMMARY OF THE INVENTION

The present invention has been made to solve the aforementioned problems, and has as its object to provide an analog synchronization circuit which can prevent any quantization errors, and can make the delay amounts of forward and backward pulses equal to each other.

The object of the present invention is achieved by the following apparatus.

An analog synchronization circuit comprises: a first capacitor; a first current source circuit for starting charging of the first capacitor in response to a first clock signal, the first current source circuit stopping charging in response to a second clock signal delayed behind the first clock signal; a second capacitor; a second current source circuit for starting charging of the second capacitor in response to the second clock signal; and a comparator for comparing voltages of the first and second capacitors and generating a timing signal when the two voltages match.

The object of the present invention is achieved by the following apparatus.

An analog synchronization circuit comprises: a first capacitor; a first current source circuit for starting charging of the first capacitor in response to a first clock signal, the first current source circuit stopping charging in response to a second clock signal delayed n clocks behind the first clock signal; a second capacitor; a second current source circuit for starting charging of the second capacitor in response to the second clock signal, the second current source circuit having a current amount n times a current amount of the first current source circuit; and a comparator for comparing voltages of the first and second capacitors, the comparator generating a timing signal when charged voltages of the first and second capacitors match.

The object of the present invention is achieved by the following apparatus.

An analog synchronization circuit comprises: a first capacitor; a first current source circuit for starting charging of the first capacitor in response to a first clock signal, the first-current source circuit stopping charging in response to a second clock signal delayed n clocks behind the first clock signal; a second capacitor having a capacitance 1/n a capacitance of the first capacitor; a second current source circuit for starting charging of the second capacitor in response to the second clock signal; and a comparator for comparing voltages of the first and second capacitors, the comparator generating a timing signal when charged voltages of the first and second capacitors match.

The object of the present invention is achieved by the following apparatus.

An analog synchronization circuit comprises: a first capacitor; a first current source circuit for starting charging of the first-capacitor in response to a first clock signal, the first current source circuit divisionally charging the first capacitor by 1/n from the first clock signal, and stopping charging in response to a second clock signal delayed n clocks behind the first clock signal; a second capacitor; a second current source circuit for starting charging of the second capacitor in response to the second clock signal, the second current source circuit having a current amount n times a current amount of the first current source circuit; and a comparator for comparing voltages of the first and second capacitors, the comparator generating a timing signal when charged voltages of the first and second capacitors match.

According to the present invention, the delay time can be detected as an analog amount, i.e., a charge amount. For this reason, generation of quantization errors as a problem in the conventional mirror type DLL using the logic gates in the delay line can be prevented. Hence, an analog synchronization circuit that can make the delay amounts of forward and backward pulses equal to each other can be provided.

Since the capacitor is charged by a constant current source, the influences of power supply voltage drifts can be removed, and the operation margin can be improved.

Furthermore, clock signals produce noise upon traveling through the logic gates. However, since a constant current source circuit is used, AC components can be greatly reduced. For this reason, generation of noise can be remarkably suppressed.

Since external clock signals are averaged in an analog manner, jitter of the external clock signals can be suppressed. In addition, since external clock signals are averaged in an analog manner, generation of quantization errors upon averaging can also be prevented.

Furthermore, since the comparator uses an inverter circuit, the input and output terminals of which are short-circuited upon initialization, and which receives two voltages to be compared via the capacitor, a high-sensitivity comparator can be formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing the first embodiment of the present invention;

FIG. 2 is a waveform chart showing the operation of the circuit shown in FIG. 1;

FIG. 3 is a voltage waveform chart of the respective units showing the operation of the circuit shown in FIG. 1;

FIG. 4A is circuit diagram-showing an example of a circuit for generating signals shown in FIG. 1, and FIG. 4B is a partial circuit diagram of FIG. 4A;

FIG. 5 is a view for explaining the principle of a constant current source circuit;

FIG. 20A is a circuit diagram showing a circuit for generating signals shown in FIG. 18, and FIG. 20B is a partial circuit diagram of FIG. 20A;

FIG. 21 is a circuit diagram showing a charge balance delay according to the third embodiment of the present invention;

FIG. 22 is a waveform chart for explaining the principle of the fourth embodiment of the present invention;

FIG. 28 is a view for explaining the conventional problems.

DETAILED DESCRIPTION OF THE INVENTION

Figure 6:
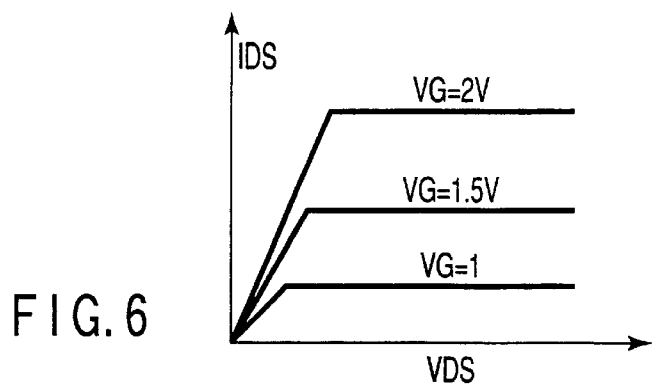
FIG. 6 is a view for explaining the principle of a constant current source circuit.

The preferred embodiments of the present invention will be described hereinafter with reference to the accompanying drawings.
(First Embodiment)

FIG. 1 shows the first embodiment of an analog synchronization circuit according to the present invention. This circuit basically has the same arrangement as that of a mirror type DLL, and has an input buffer (I.B.) 11, delay monitor (DM) 12, output buffer (O.B.) 13. The input buffer (I.B.) 11 receives an external clock signal ECLK. The delay monitor (DM) 12 receives a clock signal ICLK output from the input buffer 11. The output buffer (O.B.) 13 outputs a clock signal CK synchronized with the external clock signal ECLK.

Furthermore, the analog synchronization circuit according to the present invention has charge balance delays (to be abbreviated as CBDs hereinafter) 14 and 15 shown in FIG. 1. These CBDs 14 and 15 correspond to a delay line in the mirror type DLL. The CBDs 14 and 15 operate once per two cycles of the external clock signal, as will be described later. For this reason, the two CBDs 14 and 15 alternately operate, and the output signals from these CBDs 14 and 15 are supplied to the output buffer 13 via an OR gate 16.

Referring to FIG. 1, AND gates 17 and 18 distribute the clock signal ICLK in accordance with signals T2 and /T2 (/ indicates an inverted signal) to alternately operate the CBDs 14 and 15. The signal T2 is generated by frequency-dividing the clock signal ICLK. The AND gates 17 and 18 respectively output clock signals e-CL and o-CL. These clock signals e-CL and o-CL are respectively supplied to the CBDs 14 and 15.

FIG. 2 shows the phase relationship between the clock signal ICLK and the signals T2 and /T2.

The clock signals e-CL and o-CL supplied to the CBDs 14 and 15 to alternately operate the CBDs 14 and 15 are delayed an amount corresponding to one stage of the AND gate behind the clock signal ICLK. To compensate for this delay, a series circuit of AND gates 19 and 20, and that of AND gates 21 and 22 are inserted behind the delay monitor 12. The AND gates 20 and 22 are dummy gates, and one of their input terminals is fixed at high level, e.g., a power supply voltage Vcc. The AND gates 19 and 21 receive signals T2' and /T2' at their other input terminals. These signals T2' and /T2' are timing adjustment signals, and are generated by appropriately delaying the signals T2 and /T2.

Since the CBDs 14 and 15 have the same arrangement, the CBD 14 will be briefly explained. The CBD 14 is comprised of two capacitors C1 and C2, constant current source circuits S1 and S2 for charging these capacitors C1 and C2, a comparator (CMP) 14a for comparing voltages V1 and V2 of the capacitors C1 and C2, N-channel MOS transistors N1 and N2 for discharging the capacitors C1 and C2, and a delay circuit (DL) 14b. The capacitor C1 corresponds to the forward delay line, and the capacitor C2 to the backward delay line.

The capacitors C1 and C2 have equal capacitances, and the current amounts of the constant current source circuits S1 and S2 are set to be equal to each other. The constant current source circuit S1 starts its operation in response to a pulse signal e-dmCL supplied to its input terminal Din, and stops its operation in response to the pulse signal e-CL. The constant current source circuit S2 starts its operation in response to the pulse signal e-CL, and stops its operation in response to a signal obtained by delaying a pulse signal e-CK by the delay circuit 14b. Detailed arrangements of the constant current source circuits S1 and S2, and the comparator 14a will be explained later.

The operation of the CBD 14 will be explained below with reference to FIG. 3. When the pulse signal e-dmCL output from the AND gate 20 is supplied to the input terminal Din, the constant current source circuit S1 begins to charge the capacitor C1. Since this capacitor C1 is charged by a constant current, the voltage V1 at the node between the constant current source circuit S1 and capacitor C1 increases at a constant rate. When the pulse signal e-CL is then supplied from the AND gate 17, charging of the capacitor C1 stops, and that of capacitor C2 starts at the same time. The comparator 14a outputs the pulse signal e-CK to an output terminal Dout when the voltage V2 at the node between the constant current source circuit S2 and capacitor C2 becomes equal to the voltage V1. This signal is supplied to the constant current source circuit S2 via the delay circuit 14b to stop the operation of the constant current source circuit S2.

The capacitances of the capacitors C1 and C2 are equal to each other, and the current amounts supplied by the constant current source circuits S1 and S2 are also equal to each other. For this reason, the time required for charging the capacitor C1 up to the voltage V1 becomes equal to the time required for charging the capacitor C2 up to the voltage V2. As a result, as shown in FIG. 3, the same time as that from when the pulse signal e-dmCL is supplied to the input terminal Din until the pulse signal e-CL is supplied is mirrored to the time from when the pulse signal e-CL is supplied until the pulse signal e-CK is output to the output terminal Dout. Since the voltages V1 and V2 shown in FIG. 3 are analog amounts, no quantization errors are produced at all upon mirroring the charging times.

Note that the transistor N1 is enabled when the pulse signal o-CL is supplied from the AND gate 18 to the CBD 15, thus discharging the capacitor C1. Also, the transistor N2 is enabled by the output pulse e-CK from the comparator 14a, which is delayed by the delay circuit 14b, thus discharging the capacitor C2. On the other hand, a transistor N1 (not shown) of the CBD 15 is enabled when the pulse signal e-CL is supplied from the AND gate 17, thus discharging the capacitor C1.

FIG. 4A shows an example of a circuit for generating the signals T2 and /T2 from the clock signal ICLK. FIG. 4B shows an example of a delay circuit (DL) shown in FIG. 4A. In the delay circuit shown in FIG. 4B, a clocked inverter circuit is controlled by signals a and /a supplied from the circuit shown in FIG. 4A.

FIGS. 5 and 6 show the principle of the constant current source circuits S1 and S2. In this case, in an N-channel MOS transistor shown in, e.g., FIG. 5, even when a source-drain voltage VDS has drifted, a current amount IDS remains unchanged if a gate voltage VG is appropriately set. For this reason, such characteristics are expressed as shown in FIG. 6, and the N-channel MOS transistor can be used as a constant current source. Not only the N-channel MOS transistor but also a P-channel MOS transistor can be used as a constant current source by appropriately setting the gate voltage. When a capacitor is charged from a ground potential Vss, a P-channel MOS transistor is used as a constant current source to assure excellent constant current characteristics rather than an N-channel MOS transistor, since it suffers less source voltage drifts.

Figure 7A:
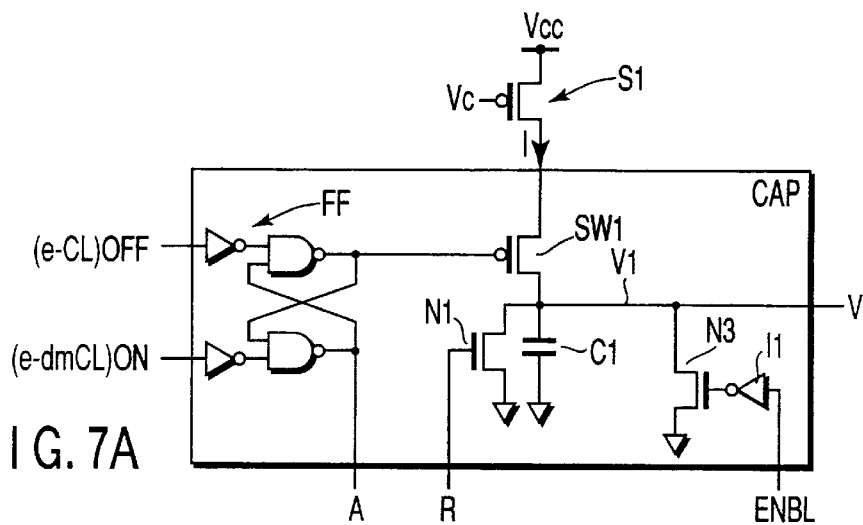
FIG. 7A is a circuit diagram showing the constant current source circuit and a capacitor unit.
Figure 7B:
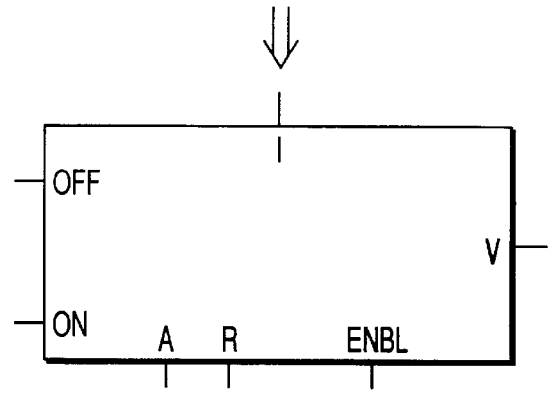
FIG. 7B is a view showing the capacitor unit shown in FIG. 7A as symbols.

FIG. 7A shows a capacitor unit CAP including the constant current source circuit S1 using the P-channel MOS transistor, and the capacitor C1, and the same reference numerals in FIG. 7A denote the same parts as in FIG. 1. FIG. 7B shows a state wherein the capacitor unit CAP shown in FIG. 7A is expressed by symbols, and the same reference numerals in FIG. 7B denote the same parts as in FIG. 7A.

In the constant current source circuit S1 shown in FIG. 7A, a power supply Vcc is supplied to the source of a P-channel MOS transistor, and a voltage Vc is supplied to the gate. The drain of this P-channel MOS transistor is connected to the capacitor C1 via a switch SW1 comprising the P-channel MOS transistor of the capacitor unit CAP. One output terminal of a flip-flop circuit FF is connected to the gate of the switch SW1. One input terminal ON of this flip-flop circuit FF receives the output signal e-dmCL from the AND gate 20, and the other input terminal OFF receives the pulse signal e-CL output from the AND gate 17. One output terminal of this flip-flop circuit FF changes to low level in response to a signal at one input terminal ON, and the switch SW1 is enabled accordingly, thus starting charging of the capacitor C1.

On the other hand, one output terminal changes to high level in response to the pulse, signal e-CL supplied to the other input terminal OFF of the flip-flop circuit FF, and the switch SW1 is disabled accordingly, thus stopping charging of the capacitor C1. The other output terminal of the flip-flop circuit FF is connected to an output node A. The gate of the transistor N1 is connected to an input node R. An N-channel MOS transistor N3 is inserted between the node between the switch SW1 and capacitor C1, and ground. The gate of this transistor N3 receives an enable signal ENBL via an inverter circuit I1. The transistor N3 prevents operation errors of the comparator, and is disabled when the enable signal ENBL is at high level.

Figure 8:
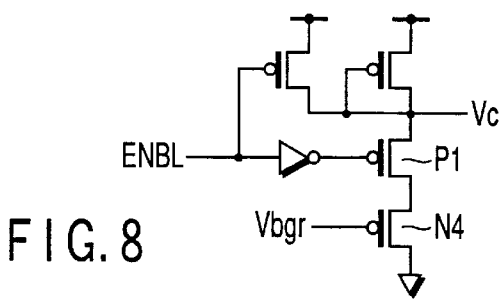
FIG. 8 is a circuit diagram showing a generation circuit of a constant voltage Vc shown in FIG. 1.

FIG. 8 shows a generation circuit of the voltage Vc. In this generation circuit, a P-channel MOS transistor P1 is enabled when the enable signal ENBL is at high level. An N-channel MOS transistor N3, which is connected between the transistor P1 and ground, receives a reference signal Vbgr at its gate, and is normally ON. The reference signal Vbgr is a temperature-compensated voltage, which is generated by, e.g., a band gap reference circuit or the like. For this reason, when the enable signal ENBL is set at high level, a low-level voltage Vc is output via the P-channel MOS transistor P1 and N-channel MOS transistor N4. By appropriately setting this voltage Vc, the constant current source circuit S1 can obtain desired constant current characteristics.

Note that the present invention uses the constant current source circuits to make the charging times of the capacitors C1 and C2 equal to each other. However, when the charging time becomes long and the charging voltage becomes high, the drain-source voltage VDS of the MOS transistor becomes small, and desired constant current characteristics cannot be obtained. However, even when the constant current characteristics have drifted more or less, the drift amounts can become equal to each other if the constant current source circuits having the same arrangement are used to charge the capacitors C1 and C2. For this reason, the charging times of the capacitors C1 and C2 become equal to each other, and no problem is posed.

On the other hand, as the CBD, when the capacitor is charged to, e.g., the power supply voltage Vcc and is then discharged at a constant current, an N-channel MOS transistor is suitably used as the constant current source circuit.

Figure 9A:
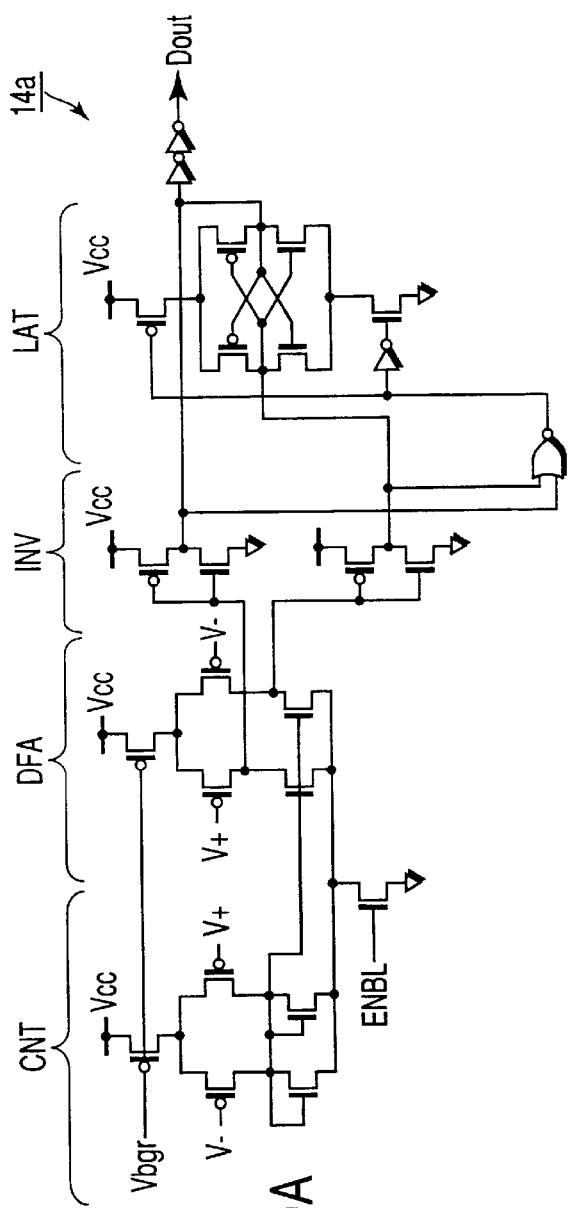
FIG. 9A is a circuit diagram showing an example of a comparator shown in FIG. 1.
Figure 9B:
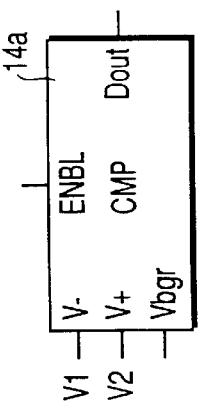
FIG. 9B is a view showing the comparator shown in FIG. 9A as symbols.

FIG. 9A is a circuit diagram showing an example of the comparator 14a, and FIG. 9B shows a state wherein the comparator shown in FIG. 9A is expressed by symbols. Referring to FIG. 9A, the comparator 14a comprises a differential amplifier DFA, a control circuit CNT for matching the leading and trailing edges of differential output signals of the differential amplifier DFA, an inverter circuit INV for receiving the differential output signals of the differential amplifier DFA, and a latch circuit LAT for latching the output signal from the inverter circuit INV. The differential amplifier DFA and control circuit CNT are comprised of P-channel MOS transistors which have high sensitivity even when the voltages V1 and V2 are relatively low.

As described above, when the capacitor is discharged from a state charged to Vcc in accordance with a delay time, the differential amplifier DFA and control circuit CNT can be comprised of N-channel MOS transistors.

In order to set high sensitivity over a broad voltage range of the voltages V1 and V2, a differential amplifier comprising a P-channel MOS transistor, and that comprising an N-channel MOS transistor may be appropriately combined.

Figure 10:
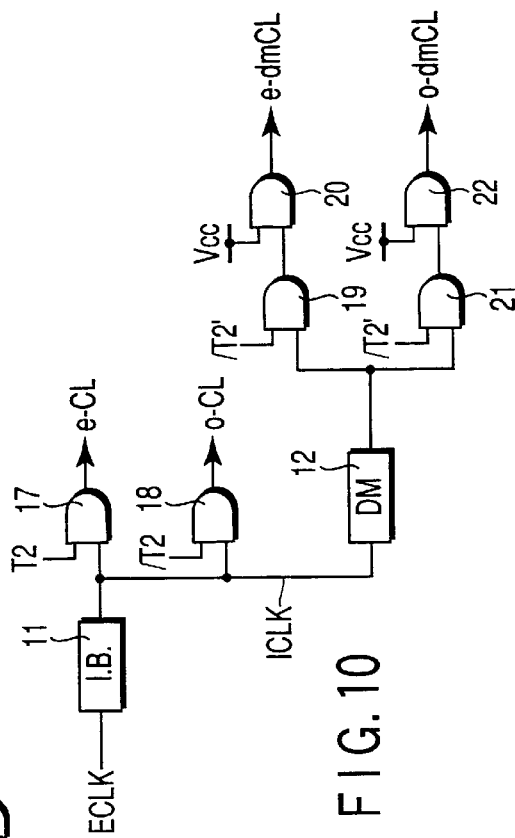
FIG. 10 is a partial circuit diagram showing a practical arrangement of an analog synchronization circuit according to the present invention shown in FIG. 1.
Figure 11:
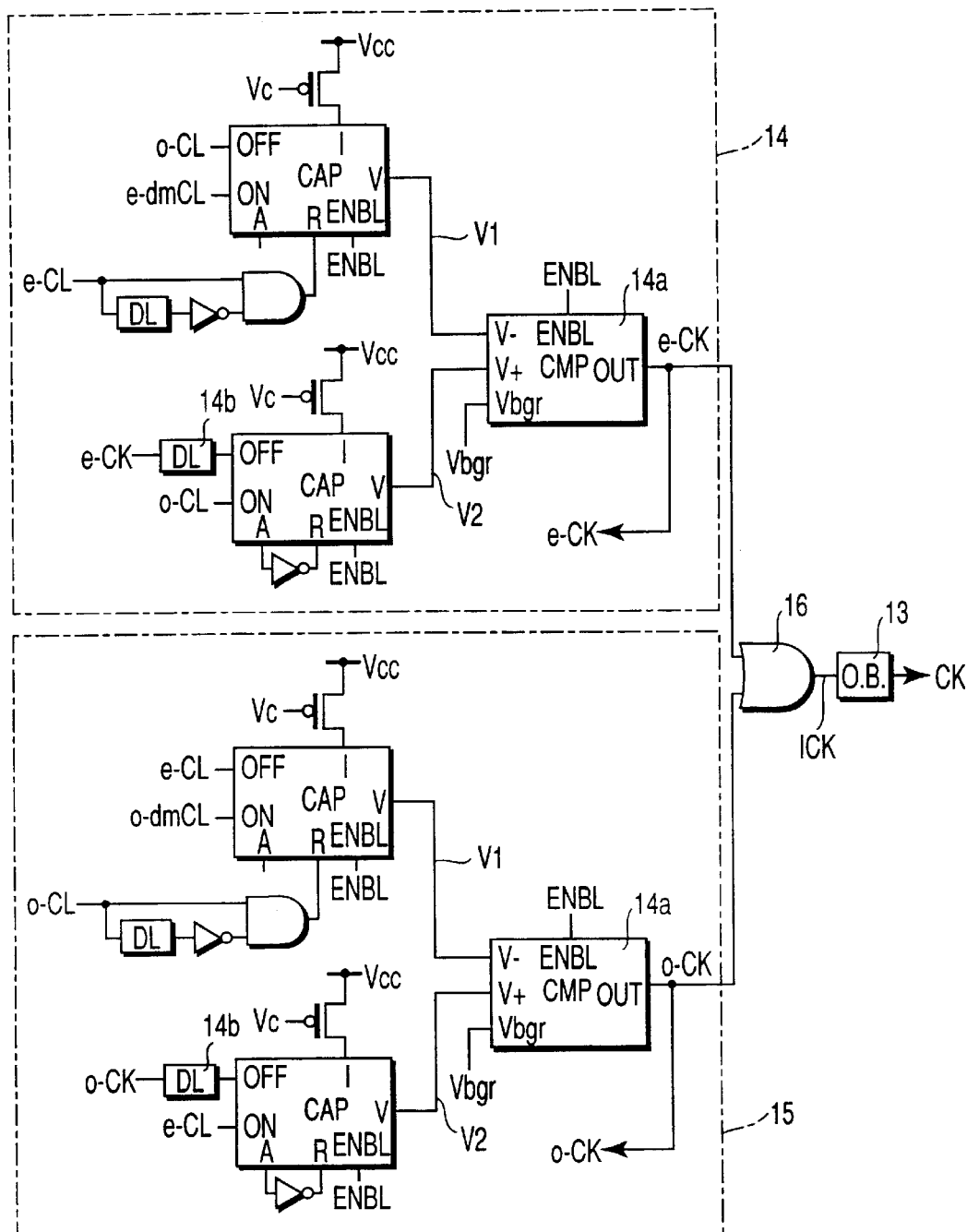
FIG. 11 is a partial circuit diagram showing a practical arrangement of an analog synchronization circuit according to the present invention shown in FIG. 1.

FIGS. 10 and 11 show the analog synchronization circuit shown in FIG. 1 using the constant current source circuit and capacitor unit CAP shown in FIGS. 7A and 7B, and the comparator shown in FIGS. 9A and 9B, and the same reference numerals in FIGS. 10 and 11 denote the same parts as in FIG. 1.

Figure 12:
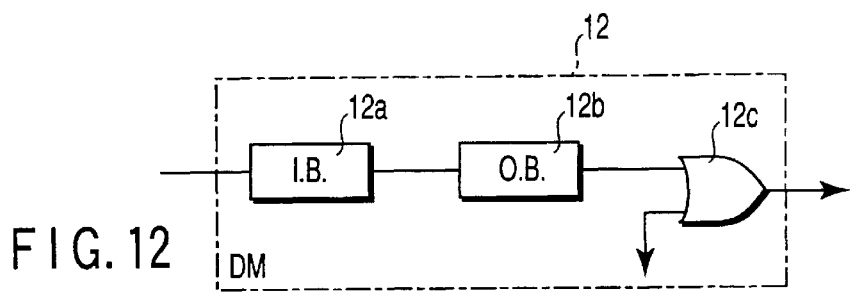
FIG. 12 is a diagram showing an example of a delay monitor shown in FIG. 10.

FIG. 12 shows the arrangement of the delay monitor 12 shown in FIGS. 1 and 10. This delay monitor 12 is constructed by a series circuit of a replica circuit (I.B.) 12a of the input buffer 11, a replica circuit (O.B.) 12b of the output buffer 13, and a replica circuit 12c of the OR gate 16.

According to the first embodiment, the delay circuit in the mirror type DLL is constituted by the capacitors C1 and C2 charged by the constant current source circuits S1 and S2, and the comparator 14a for comparing the voltages of these capacitors, and the delay times of forward and backward pulses are replaced by the charge amounts accumulated on the capacitors. More specifically, the capacitor C1 is charged by the constant current source circuit S1 for a time corresponding to the delay time of forward pulses, the capacitor C2 having the same capacitance as that of the capacitor C1 is charged by the constant current source circuit S2 having the same current amount as that of the constant current source circuit S1, the voltages V1 and V2 of these capacitors C1 and C2 are compared by the comparator 14a, and a signal is output when these voltages match. Hence, since the delay times of pulse signals are controlled by replacing them by analog values, generation of quantization errors can be prevented unlike in the prior art.

In addition, the capacitances of the capacitors C1 and C2 are equal to each other, and the current amounts of the constant current source circuits S1 and S2 are set to be equal to each other. Hence, since the time required for charging the capacitor C1 up to the voltage V1 can become equal to the time required for charging the capacitor C2 up to the voltage V2, the charging time of the capacitor C1 can be accurately mirrored to that of the capacitor C2.

When the delay circuit is built by a plurality of logic gates like in the prior art, noise is produced upon operation of the delay circuit. However, when the delay circuit is made up of capacitors like in this embodiment, generation of noise can be suppressed.

Furthermore, since the constant current source circuit can be constructed by a P- or N-channel MOS transistor controlled by a,voltage, the circuit arrangement can be simplified.

Also, if a value obtained by dividing the capacitance of the capacitor C1 by the current amount of the constant current source circuit S1 is equal to that obtained by dividing the capacitance of the capacitor C2 by the current amount of the constant current source circuit S2, i.e., the ratio of the capacitor C1 and the current amount of the constant current source circuit S1, and the ratio of the capacitor C2 and the current amount of the constant current source circuit S2 equal a predetermined ratio, the current amounts of the two constant current source circuits or the capacitances of the two capacitors need not always be equal to each other.

Moreover, circuits for charging the capacitors C1 and C2 are not limited to the constant current source circuits, but may be current source circuits.

(Second Embodiment)

Figure 13:
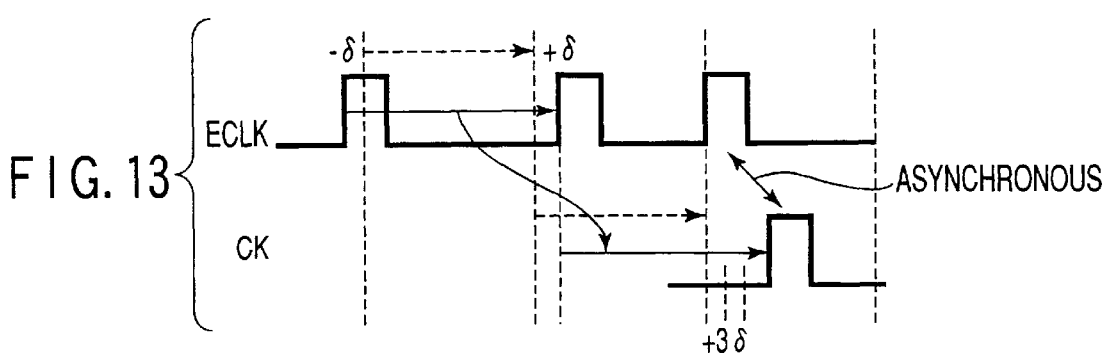
FIG. 13 is a waveform chart for explaining problems of a mirror type DLL.
Figure 14:
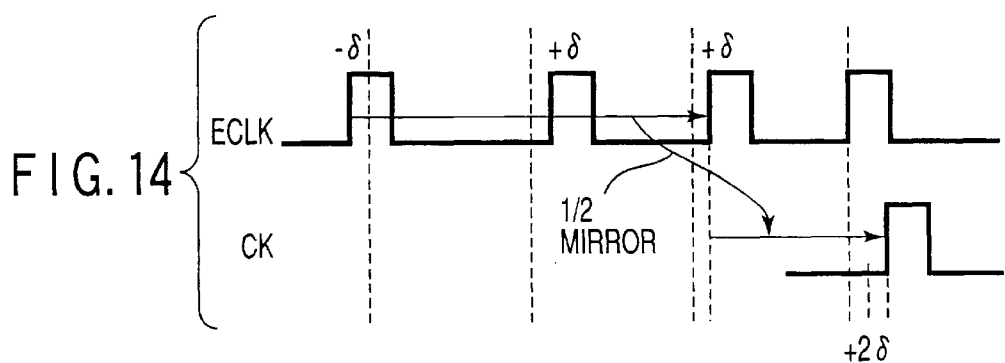
FIG. 14 is a waveform chart for explaining the principle of the second embodiment of the present invention.

As shown in FIG. 13, a mirror type DLL may generate a clock signal ICLK that amplifies jitter δ of an external clock signal ECLK to 3δ (three times in the worst case). To combat this problem, in place of mirroring the time (one cycle) between two clock signals, as shown in FIG. 13, a time half two cycles is mirrored, as shown in FIG. 14, thus averaging and reducing jitter. Likewise, when the time ⅓ three cycles is mirrored, since the average of three cycles is computed, jitter can be further reduced.

Figure 15:
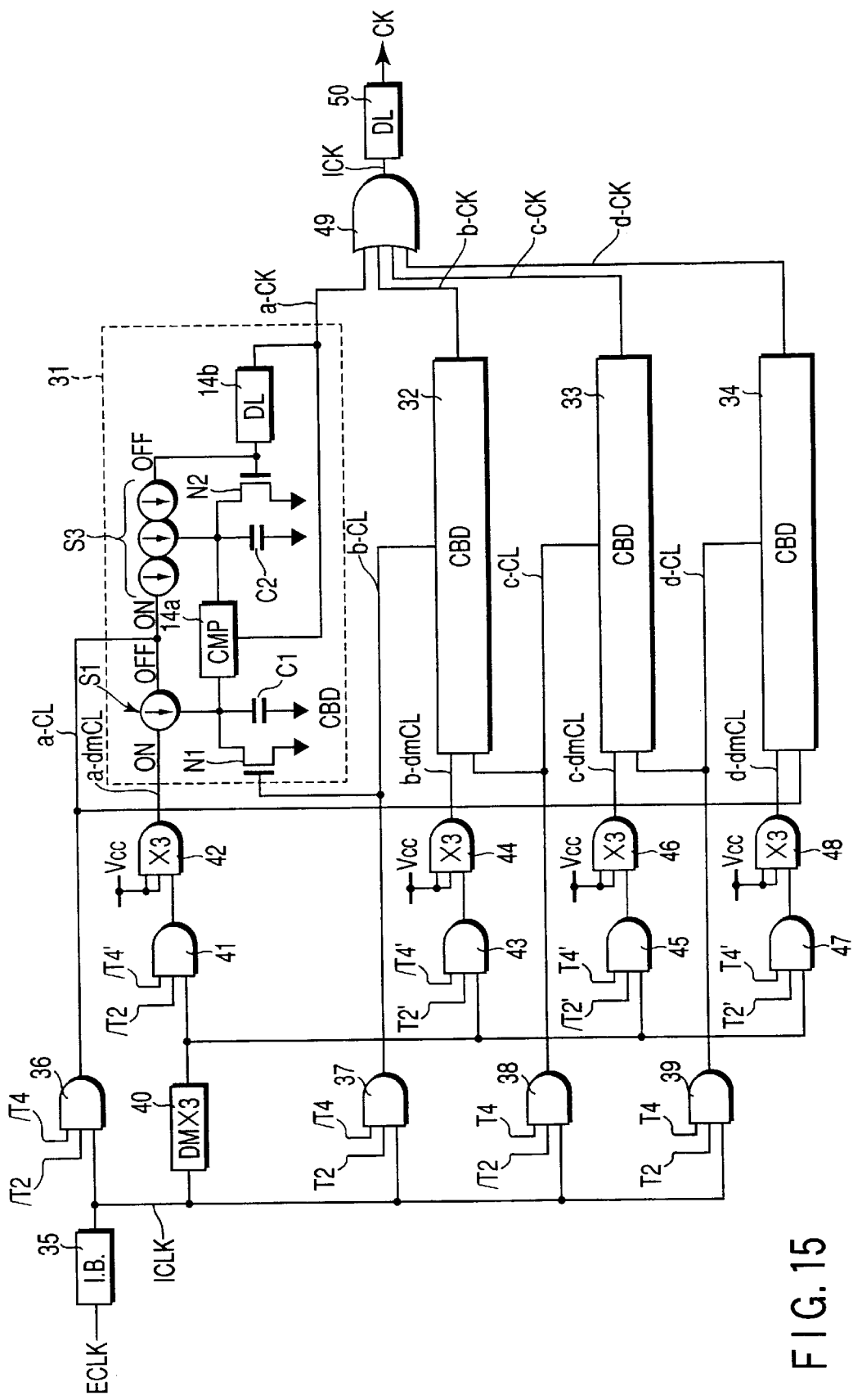
FIG. 15 is a circuit diagram showing the second embodiment of the present invention.

FIG. 15 shows the second embodiment of the present invention, i.e., a mirror type DLL circuit that averages three cycles of the external clock signal ECLK. The circuit shown in FIG. 15 is substantially the same as that shown in FIG. 1, except for the arrangement of the CBDs. Hence, the same reference numerals in FIG. 15 denote the same parts as in FIG. 1.

In the CBD shown in FIG. 15, the constant current source circuit S1 for charging the capacitor C1 is the same as that shown in FIG. 1. However, the current amount of a constant current source circuit S3 for charging the capacitor C2 is set to be three times that of the constant current source circuit S1. With this arrangement, the capacitor C2 can be charged for a time ⅓ the time required for charging the capacitor C1. For this reason, when the capacitor C1 is charged for a time for three cycles, the capacitor C2 can output a clock signal delayed one cycle, i.e., ⅓ the three cycles.

The circuit shown in FIG. 15 executes a process once per four clocks of the external clock signal. For this reason, four CBDs 31, 32, 33, and 34 are provided, and operate in turn. A circuit for operating the CBDs 31, 32, 33, and 34 in turn is provided. More specifically, the external clock signal ECLK is supplied to an input buffer 35, and a clock signal ICLK output from this input buffer 35 is distributed by AND gates 36, 37, 38, and 39, which selectively receive signals T2 and /T2, and signals T4 and /T4. Clock signals a-CL, b-CL, c-CL, and d-CL output from these AND gates 36, 37, 38, and 39 are respectively supplied to the CBDs 31, 32, 33, and 34.

Figure 18:
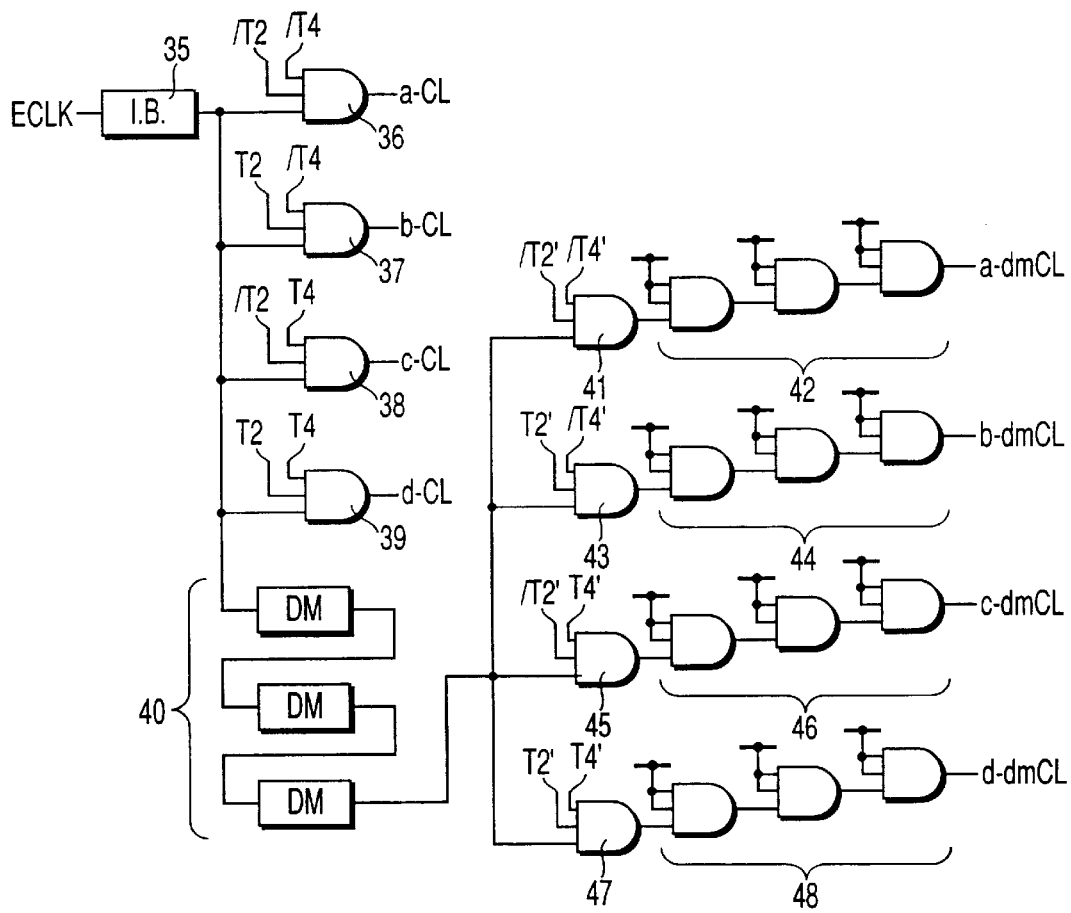
FIG. 18 is a partial circuit diagram showing details of FIG. 15.

A delay monitor DM 40 is the same as the circuit shown in FIG. 12, and is comprised of a series circuit of replica circuits of the input buffer 35, an output buffer 50, and an OR gate 39. Furthermore, in order to triple the delay time, three delay monitors DM 40 are connected in series with each other, as shown in FIG. 18. FIG. 15 expresses this state by DM×3. A series circuit of AND gates 41 and 42 for timing adjustment, a series circuit of AND gates 43 and 44, a series circuit of AND gates 45 and 46, and a series circuit of AND gates 47 and 48 are connected to the output terminal of the delay monitor DM 40. The AND gates 41, 43, 45, and 47 selectively receive signals T2' and /T2' and signals T4' and /T4'. Each of the AND gates 42, 44, 46, and 48 is constructed by a series circuit of three AND gates, one input terminals of which are fixed at high level, e.g., a power supply voltage Vcc, as shown in FIG. 18. FIG. 15 expresses this state by "×3". Clock signals a-dmCL, b-dmCL, c-dmCL, and d-dmCL output from the AND gates 42, 44, 46, and 48 are respectively supplied to the CBDs 31, 32, 33, and 34. The output signals from these CBDs 31, 32, 33, and 34 are supplied to the output buffer 50 via an OR gate 49.

In FIG. 15, the signal T2 is a clock signal obtained by frequency-dividing the clock signal ICLK by 2, as described above. Also, the signal T4 is a clock signal obtained by frequency-dividing the clock signal ICLK by 4, and the signal /T4 is the inverted signal of the signal T4. Furthermore, the signals T4' and /T4' are obtained by appropriately delaying the signals T4 and /T4 to attain timing adjustment as in the signals T2' and /T2'.

Figure 16:
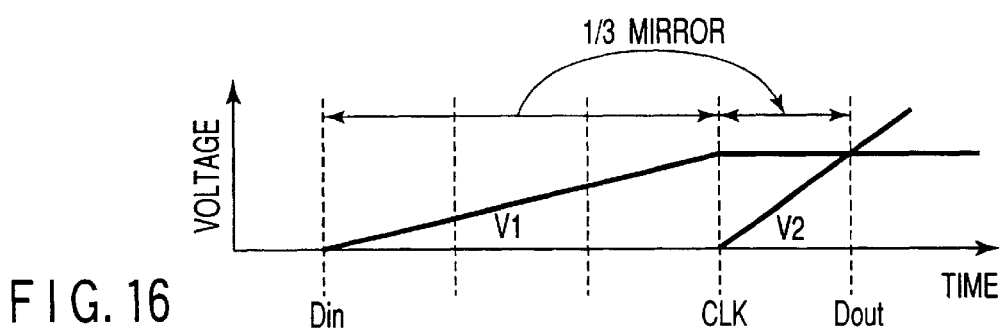
FIG. 16 is a voltage waveform chart of respective units for explaining the operation of FIG. 15.

FIG. 16 shows changes in voltages V1 and V2 of the capacitors C1 and C2 in the CBD 31 shown in FIG. 15. In the above arrangement, the current of the constant current source circuit S3 is three times that of the constant current source circuit S1. For this reason, the charging time until the voltage V2 of the capacitor C2 matches the voltage V1 of the capacitor C1 can be shortened to ⅓. Hence, when the capacitor C1 is charged for a time corresponding to three cycles, the capacitor C2 can output a clock signal delayed one cycle, i.e., ⅓ the three cycles.

Figure 17:
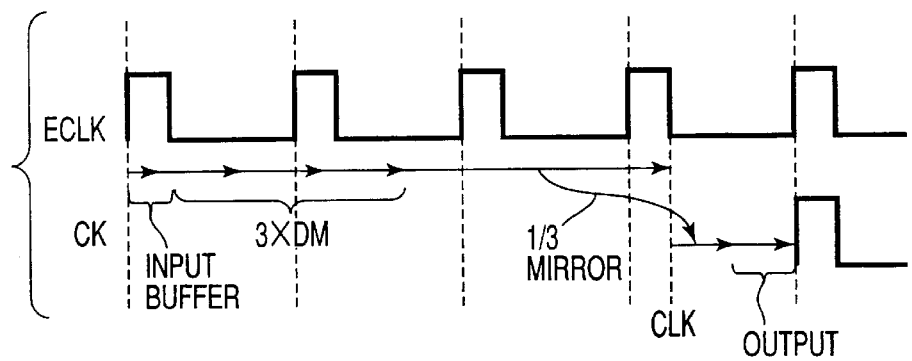
FIG. 17 is a waveform chart for explaining the operation of FIG. 15.

FIG. 17 shows the generation timing of an internal clock signal CK from external clock signals ECLK.

According to the second embodiment, since the time ⅓ three cycles of the external clock signal ECLK is mirrored, the three cycles are averaged. For this reason, jitter can be reduced.

Since the delay time is determined by an analog amount, i.e., the charge amount, averaging can be attained strictly, and no quantization errors are produced upon averaging.

Figure 19:
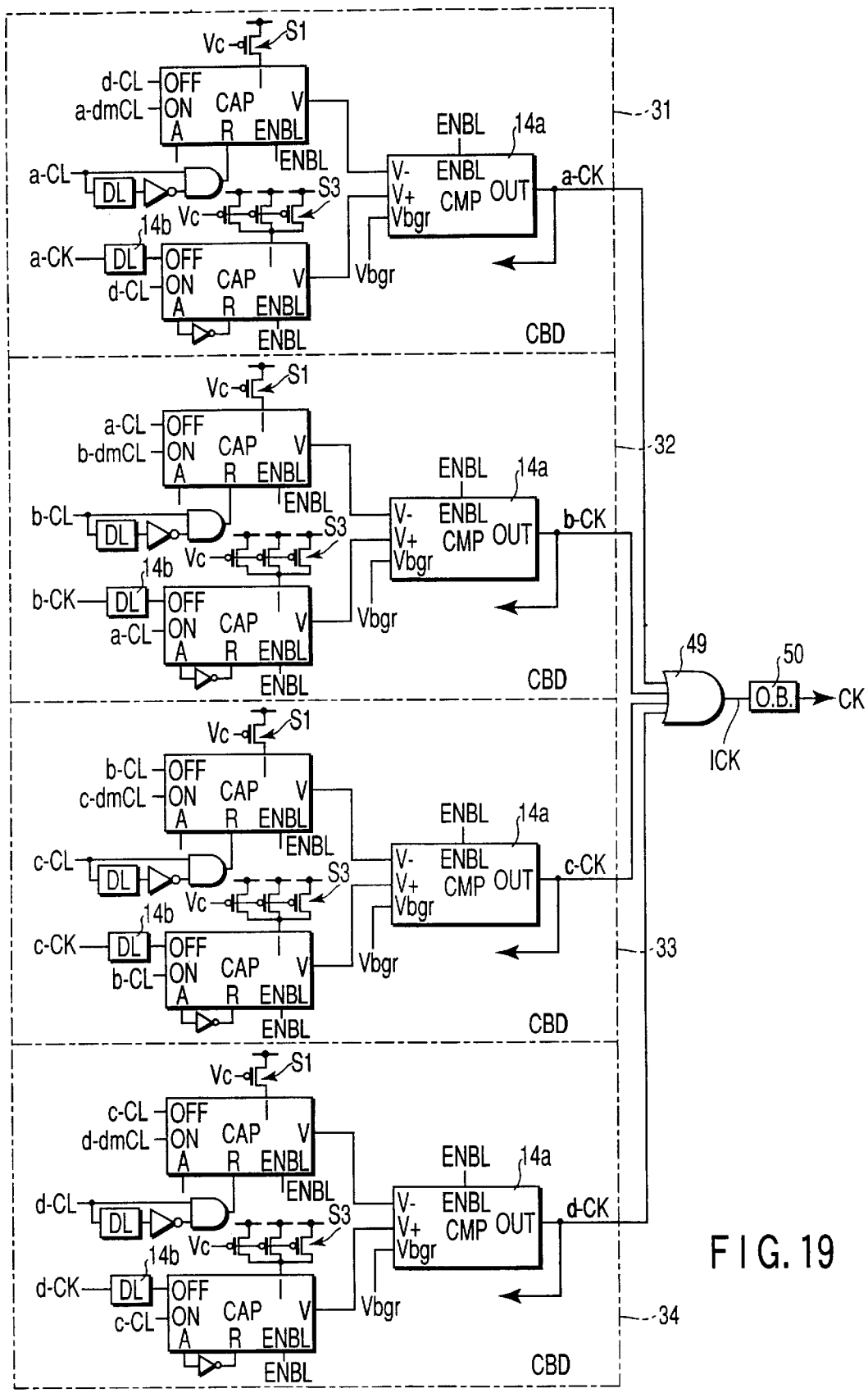
FIG. 19 is a partial circuit diagram showing details of FIG. 15.

FIGS. 18 and 19 are circuit diagrams showing FIG. 15 in detail, and the same reference numerals in FIGS. 18 and 19 denote the same parts as in FIG. 15. FIG. 19 shows the CBDs 31 to 34 in FIG. 15 using the same symbols as in FIG. 11. In FIG. 19, each constant current source circuit S3 is comprised of a parallel circuit of three P-channel MOS transistors having the same size, and a voltage Vc is supplied to the gates of these transistors.

FIG. 20A shows an example of a circuit for generating the signals T4 and /T4 from the clock signal ICLK. FIG. 20B shows an example of a delay circuit (DL) shown in FIG. 20A. In the delay circuit shown in FIG. 20B, a clocked inverter circuit is controlled by signals b and /b supplied from the circuit shown in FIG. 20A.

Note that the second embodiment averages three cycles, but jitter can be further reduced by increasing the number of cycles to be averaged.

(Third Embodiment)

FIG. 21 shows the third embodiment of the present invention. In the second embodiment, the current amount of the constant current source circuit S3 for charging the capacitor C2 is set to be three times that of the constant current source circuit S1. By contrast, the third embodiment sets the capacitance of a capacitor C3 to be three times that of the capacitor C2, and uses constant current source circuits S1 and S2 having equal current amounts. The operation of the CBD shown in FIG. 21 is substantially the same as that shown in FIG. 15, and the charging time of the capacitor C2 is ⅓ that of the capacitor C3. With this arrangement, the same effect as in the second embodiment can be obtained.

(Fourth Embodiment)

In the second embodiment, the charging time of the capacitor C1 is set to be three times that of the capacitor C2 to reduce the influences of jitter, and the capacitor C1 is charged to a predetermined voltage at one time; as shown in FIG. 16. By contrast, in the fourth embodiment, the capacitor C1 is divisionally charged in three steps, as shown in FIG. 22.

Figure 23:
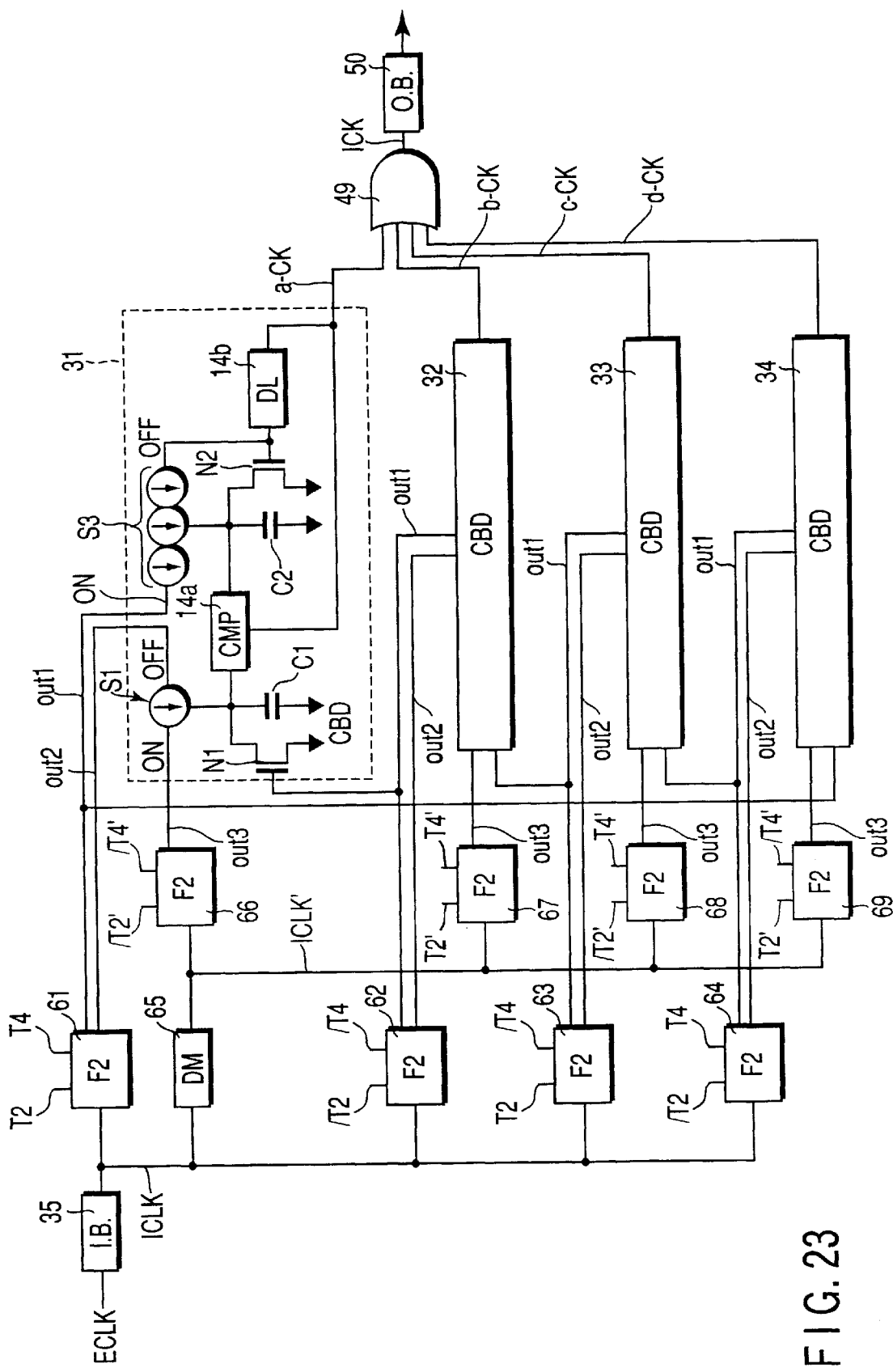
FIG. 23 is a circuit diagram showing the fourth embodiment of the present invention.

FIG. 23 shows the arrangement of the fourth embodiment, and the same reference numerals in FIG. 23 denote the same parts as in FIG. 15. Referring to FIG. 23, the clock signal ICLK output from the input buffer 35 is supplied to logic circuits (F1) 61, 62, 63, and 64. These logic circuits 61, 62, 63, and 64 selectively receive the signals T2 and /T2 and signals T4 and /T4. The logic circuits 61, 62, 63, and 64 generate timing signals out1 and out2 for controlling charging of the capacitors C1 and C2 which construct the CBDs 31, 32, 33, and 34 in accordance with the signals T2 and /T2 and signals T4 and /T4. The timing signal out1 is supplied to the constant current source circuit S3 as a start signal that constructs each of the CBDs 31, 32, 33, and 34, and is also supplied to the gate of an N-channel MOS transistor N1 that constructs each of the CBDs 31, 32, 33, and 34 as a discharge timing control signal. That is, the timing signal out1 supplied from the logic circuit 61 is supplied to the CBD 34, and the timing signal out1 supplied from the logic circuit 62 is supplied to the CBD 31. The timing signal out1 supplied from the logic circuit 63 is supplied to the CBD 32, and the timing signal out1 supplied from the logic circuit 64 is supplied to the CBD 33.

The timing signal out2 is supplied to the constant current source circuit S1 that constructs each of the CBDs 31, 32, 33, and 34 as a stop signal.

Unlike in the third embodiment, a delay monitor 65 is comprised of one stage of replica circuits of the input buffer 35, output buffer 50, and OR gate 49. A clock signal ICLK' output from this delay monitor 65 is supplied to logic circuits (F2) 66, 67, 68, and 69. These logic circuits. (F2) 66, 67, 68, and 69 selectively receive the signals T2' and /T2' and signals T4' and /T4', and output a timing signal out3 in accordance with these signals. The timing signal out3 is supplied to the constant current source circuit S1 that constructs each of the CBDs 31, 32, 33, and 34 as a start signal.

Figure 24:
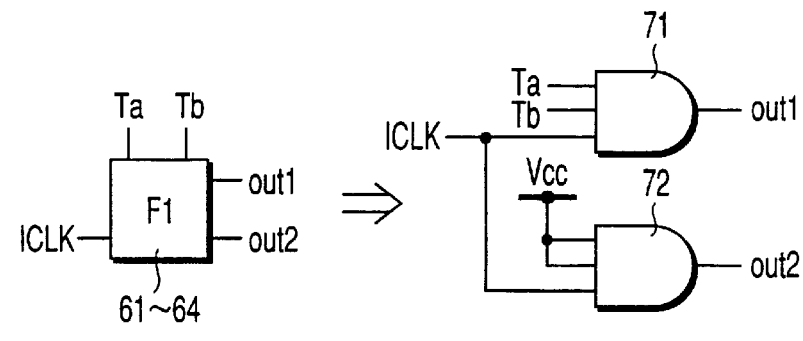
FIG. 24 is a partial circuit diagram showing details of the circuit shown in FIG. 23.

FIG. 24 shows the arrangement of the logic circuits (F1) 61 to 64. Signals Ta and Tb respectively indicate the signals T2 and /T2, and signals T4 and /T4. Each of these logic circuits 61 to 64 comprises AND gates 71 and 72, which respectively output the timing signals out1 and out2.

Figure 25:
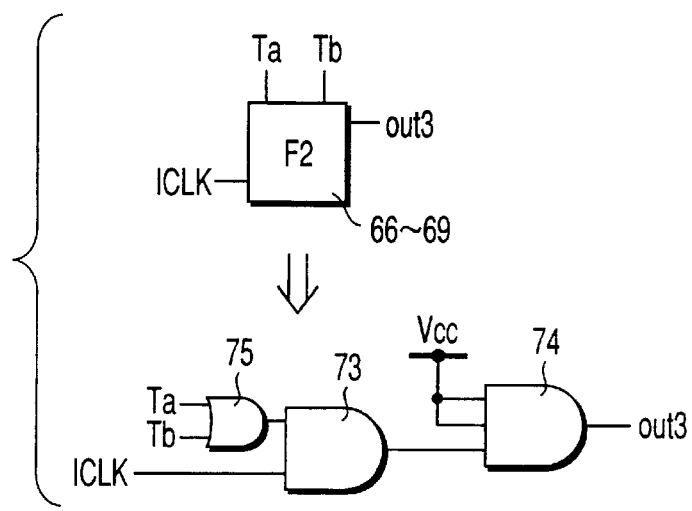
FIG. 25 is a partial circuit diagram showing details of the circuit shown in FIG. 23.

FIG. 25 shows the arrangement of the logic circuits (F2) 66 to 69. Signals Ta and Tb respectively indicate the signals T2' and /T2', and signals T4' and /T4'. Each of these logic circuits 66 to 69 comprises AND gates 73 and 74, and an OR-gate 75, and the AND gate 74 outputs the timing signal out3.

According to the fourth embodiment, as shown in FIG. 22, the constant current source circuit S1 operates for each cycle of the external clock signal ECLK, and the capacitor C1 is divisionally charged in three steps. For this reason, the delay monitor 65 need not have a triple delay time unlike in the second embodiment. For this reason, the circuit area of the delay monitor 65 and accumulation of errors can be reduced.

(Fifth Embodiment)

In each of the above embodiments, the potential difference between the voltages V1 and V2 of the capacitors C1 and C2 is detected by a comparator comprising a differential amplifier. By contrast, the fifth embodiment will explain a comparator using an inverter circuit.

Figure 26:
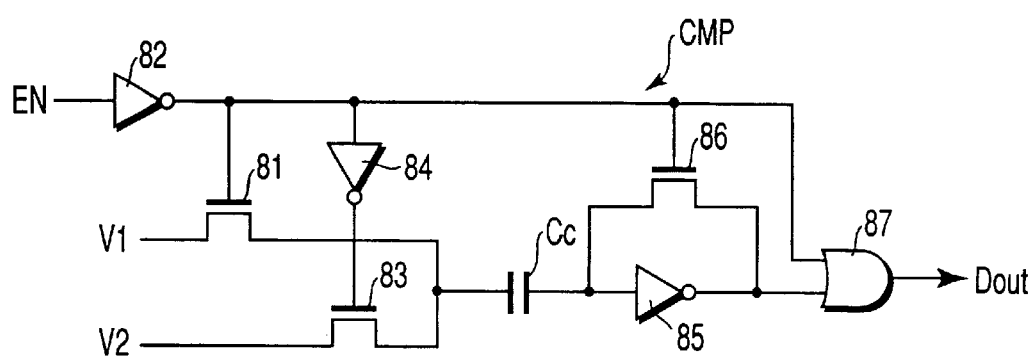
FIG. 26 is a circuit diagram showing the fifth embodiment of the present invention.
Figure 27:
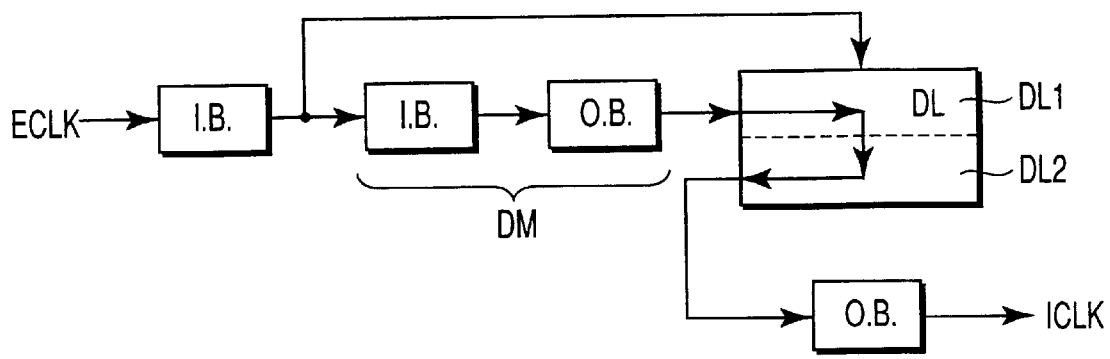
FIG. 27 is a circuit diagram showing an example of a conventional mirror type DLL.

FIG. 26 is a circuit diagram of a comparator according to the fifth embodiment. In this comparator CMP, one end of the current path of an N-channel MOS transistor 81 receives the voltage V1 of the capacitor C1. The gate of this transistor 81 receives an enable signal EN such as a clock signal e-CL, o-CL, or the like via an inverter circuit 82. On the other hand, one end of the current path of an N-channel MOS transistor 83 receives the voltage V2 of the capacitor C2. The gate of the transistor 83 receives the enable signal EN via the inverter circuit 82 and an inverter circuit 84. The other end of each of the current paths of the transistors 81 and 83 is connected to one terminal of a capacitor Cc. The other terminal of this capacitor Cc is connected to the input terminal of an inverter circuit 85. The output and input terminals of this inverter circuit 85 are connected to each other via an N-channel MOS transistor 86. The output terminals of the inverter circuits 85 and 82 are respectively connected to the input terminals of a NOR gate 87.

In the above arrangement, for example, when the enable signal EN is at low level, the capacitor Cc receives the voltage V1 of the capacitor C1 via the transistor 81. Since the transistor 86 is enabled, the input and output of the inverter circuit 85 are short-circuited and initialized. Therefore, an operation point at which the output can change most abruptly and has highest sensitivity is assured is set in the characteristics of the inverter circuit 85. At this time, the output signal of the NOR gate 87 is at low level.

In the above state, when the enable signal EN changes to high level, the transistor 86 is turned off, and initialization of the inverter circuit 85 stops. Also, since the transistor 83 is enabled, the voltage of the capacitor C2 is supplied to one terminal of the capacitor Cc. When the voltage V2 is lower than the voltage V1, since the voltage at the other terminal of the capacitor Cc changes to low level due to coupling, the output signal of the NOR gate 87 is also at low level. On the other hand, when the voltage V2 becomes slightly higher than the voltage V1, the voltage at the other terminal of the capacitor Cc rises due to coupling, and the output level of the inverter circuit 85 is inverted. For this reason, the output signal of the NOR gate 87 changes to high level.

According to the above comparator CMP, when the enable signal EN changes to low level, the inverter circuit 85 is set at the highest operation point irrespective of the level of the voltage V1. For this reason, when the voltage V2 becomes equal to the voltage V1, the output signal of the inverter circuit 85 is always inverted. That is, DC voltage components of the voltages V1 and V2 are removed by the capacitor Cc, and the output signal of the NOR gate 87 is determined by only AC voltage components. For this reason, a broader operation range than a comparator using a difference amplifier can be assured.

In the circuit shown in FIG. 26, transfer gates are constructed using only the N-channel MOS transistors 81 and 83. Alternatively, CMOS transfer gates are preferably used to assure a broader operation range with respect to changes in voltages V1 and V2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An analog synchronization circuit comprising:
   a first capacitor;
   a first current source circuit for starting charging of said first capacitor in response to a first clock signal, said first current source circuit stopping the charging in response to a second clock signal delayed behind the first clock signal;
   a second capacitor;
   a second current source circuit for starting charging of said second capacitor in response to the second clock signal; and
   a comparator for comparing voltages of said first and second capacitors and generating a timing signal when the two voltages match.

2. The circuit according to claim 1, wherein a ratio of a capacitance of said first capacitor and a current amount of said first current source circuit is set to be equal to a ratio of a capacitance of said second capacitor and a current amount of said second current source circuit.

3. The circuit according to claim 1, wherein a ratio of a capacitance of said first capacitor and a current amount of said first current source circuit is different from a ratio of a capacitance of said second capacitor and a current amount of said second current source circuit at a given ratio.

4. The circuit according to claim 1, further comprising:
   a first discharging circuit connected to said first capacitor, said first discharging circuit discharging said first capacitor in response to the a third clock signal; and
   a second discharging circuit connected to said second capacitor, said second discharging circuit discharging said second capacitor in response to an output signal from said comparator.

5. The circuit according to claim 1, wherein said comparator comprises:
   a first transfer gate which has an input terminal for receiving a charged voltage of said first capacitor, and is enabled when a control signal is in a first state;
   a second transfer gate which has an input terminal for receiving a charged voltage of said second capacitor, and is enabled when the control signal is in a second state;
   a capacitor, one terminal of which is connected to output terminals of said first and second transfer gates;
   an inverter circuit, an input terminal of which is connected to the other terminal of said capacitor; and
   a third transfer gate which is connected between the input terminal and an output terminal of said inverter circuit, and is enabled when the control signal is in the first state.

6. An analog synchronization circuit comprising:

a first capacitor;

a first current source circuit for starting charging of said first capacitor in response to a first clock signal, said first current source circuit stopping the charging in response to a second clock signal delayed n clocks behind the first clock signal;

a second capacitor;

a second current source circuit for starting charging of said second capacitor in response to the second clock signal, said second current source circuit having a current amount n times a current amount of said first current source circuit; and a comparator for comparing voltages of said first and second capacitors, said comparator generating a timing signal when charged voltages of said first and second capacitors match.

7. The circuit according to claim 6, further comprising:

a first discharging circuit connected to said first capacitor, said first discharging circuit discharging said first capacitor in response to the a third clock signal; and a second discharging circuit connected to said second capacitor, said second discharging circuit discharging said second capacitor in response to an output signal from said comparator.

8. The circuit according to claim 6, wherein said comparator comprises:

a first transfer gate which has an input terminal for receiving a charged voltage of said first capacitor, and is enabled when a control signal is in a first state;

a second transfer gate which has an input terminal for receiving a charged voltage of said second capacitor, and is enabled when the control signal is in a second state;

a capacitor, one terminal of which is connected to output terminals of said first and second transfer gates;

an inverter circuit, an input terminal of which is connected to the other terminal of said capacitor; and a third transfer gate which is connected between the input terminal and an output terminal of said inverter circuit, and is enabled when the control signal is in the first state.

9. An analog synchronization circuit comprising:

a first capacitor;

a first current source circuit for starting charging of said first capacitor in response to a first clock signal, said first current source circuit stopping the charging in response to a second clock signal delayed n clocks behind the first clock signal;

a second capacitor having a capacitance 1/n a capacitance of said first capacitor;

a second current source circuit for starting charging of said second capacitor in response to the second clock signal; and a comparator for comparing voltages of said first and second capacitors, said comparator generating a timing signal when charged voltages of said first and second capacitors match.

10. The circuit according to claim 9, further comprising:

a first discharging circuit connected to said first capacitor, said first discharging circuit discharging said first capacitor in response to the a third clock signal; and a second discharging circuit connected to said second capacitor, said second discharging circuit discharging said second capacitor in response to an output signal from said comparator.

11. The circuit according to claim 9, wherein said comparator comprises:

a first transfer gate which has an input terminal for receiving a charged voltage of said first capacitor, and is enabled when a control signal is in a first state;

a second transfer gate which has an input terminal for receiving a charged voltage of said second capacitor, and is enabled when the control signal is in a second state;

a capacitor, one terminal of which is connected to output terminals of said first and second transfer gates;

an inverter circuit, an input terminal of which is connected to the other terminal of said capacitor; and a third transfer gate which is connected between the input terminal and an output terminal of said inverter circuit, and is enabled when the control signal is in the first state.

12. An analog synchronization circuit comprising:

an input buffer for receiving an external clock signal;

a first logic circuit for receiving a clock signal output from said input buffer, said first logic circuit alternately outputting first and second clock signals for each cycle of the clock signal;

a delay monitor for receiving the clock signal output from said input buffer;

a second logic circuit for receiving the clock signal output from said delay monitor, said second logic circuit alternately outputting third and fourth clock signals for each cycle of the clock signal;

a first charge balance delay for receiving the first clock signal output from said first logic circuit, and the third clock signal output from said second logic circuit;

a second charge balance delay for receiving the second clock signal output from said first logic circuit, and the fourth clock signal output from said second logic circuit;

a mixing circuit for mixing timing signals output from said first and second charge balance delays; and an output buffer for outputting an internal clock signal on the basis of an output signal from said mixing circuit, said first charge balance delay comprising:

a first capacitor;

a first constant current source circuit for starting charging of said first capacitor in response to the third clock signal, said first constant current source circuit stopping the charging in response to the first clock signal;

a second capacitor;

a second constant current source circuit for starting charging of said second capacitor in response to the first clock signal; and a first comparator for comparing voltages of said first and second capacitors, said first comparator generating a timing signal when charged voltages of said first and second capacitors match, and said second charge balance delay comprising:

a third capacitor;

a third constant current source circuit for starting charging of said third capacitor in response to the fourth clock signal, said third constant current source circuit stopping charging in response to the second clock signal;

a fourth capacitor;

a fourth constant current source circuit for starting charging of said fourth capacitor in response to the second clock signal; and a second comparator for comparing voltages of said third and fourth capacitors, said second comparator generating a timing signal when charged voltages of said third and fourth capacitors match.

13. The circuit according to claim 12, wherein a ratio of a capacitance of said first capacitor and a current amount of said first constant current source circuit is set to be equal to a ratio of a capacitance of said second capacitor and a current amount of said second constant current source circuit.

14. The circuit according to claim 12, wherein a ratio of a capacitance of said third capacitor and a current amount of said third constant current source circuit is set to be equal to a ratio of a capacitance of said fourth capacitor and a current amount of said fourth constant current source circuit.

15. The circuit according to claim 12, wherein a ratio of a capacitance of said first capacitor and a current amount of said first constant current source circuit is different from a ratio of a capacitance of said second capacitor and a current amount of said second constant current source circuit at a given ratio.

16. The circuit according to claim 12, wherein a ratio of a capacitance of said third capacitor and a current amount of said third constant current source circuit is different from a ratio of a capacitance of said fourth capacitor and a current amount of said fourth constant current source circuit at a given ratio.

17. The circuit according to claim 12, further comprising:
a first discharging circuit connected to said first capacitor, said first discharging circuit discharging said first capacitor in response to the second clock signal; and
a second discharging circuit connected to said second capacitor, said second discharging circuit discharging said second capacitor in response to an output signal from said first comparator.

18. The circuit according to claim 12, further comprising:
a third discharging circuit connected to said third capacitor, said third discharging circuit discharging said third capacitor in response to the first clock signal; and
a fourth discharging circuit connected to said fourth capacitor, said fourth discharging circuit discharging said fourth capacitor in response to an output signal from said second comparator.

19. The circuit according to claim 12, wherein said first comparator comprises:
a first transfer gate which has an input terminal for receiving a charged voltage of said first capacitor, and is enabled when a control signal is in a first state;
a second transfer gate which has an input terminal for receiving a charged voltage of said second capacitor, and is enabled when the control signal is in a second state;
a fifth capacitor, one terminal of which is connected to output terminals of said first and second transfer gates;
a first inverter circuit, an input terminal of which is connected to the other terminal of said fifth capacitor; and
a third transfer gate which is connected between the input terminal and an output terminal of said first inverter circuit, and is enabled when the control signal is in the first state.

20. The circuit according to claim 12, wherein said second comparator comprises:
a fourth transfer gate which has an input terminal for receiving a charged voltage of said third capacitor, and is enabled when a control signal is in a first state;
a fifth transfer gate which has an input terminal for receiving a charged voltage of said fourth capacitor, and is enabled when the control signal is in a second state;
a sixth capacitor, one terminal of which is connected to output terminals of said fourth and fifth transfer gates;
a second inverter circuit, an input terminal of which is connected to the other terminal of said sixth capacitor; and
a sixth transfer gate which is connected between the input terminal and an output terminal of said second inverter circuit, and is enabled when the control signal is in the first state.

21. An analog synchronization circuit comprising:
a first capacitor;
a first current source circuit for starting charging of said first capacitor in response to a first clock signal, said first current source circuit divisionally charging said first capacitor by 1/n from the first clock signal, and stopping charging in response to a second clock signal delayed n clocks behind the first clock signal;
a second capacitor;
a second current source circuit for starting charging of said second capacitor in response to the second clock signal, said second current source circuit having a current amount n times a current amount of said first current source circuit; and
a comparator for comparing voltages of said first and second capacitors, said comparator generating a timing signal when charged voltages of said first and second capacitors match.

22. The circuit according to claim 21, further comprising:
a first discharging circuit connected to said first capacitor, said first discharging circuit discharging said first capacitor in response to a third clock signal; and
a second discharging circuit connected to said second capacitor, said second discharging circuit discharging said second capacitor in response to an output signal from said comparator.

23. The circuit according to claim 21, further comprising:
an input buffer for receiving an external clock signal;
a first logic circuit for generating a first signal for stopping an operation of said first current source circuit, and generating a second signal for starting an operation of said second current source circuit in response to the external clock signal;
a delay monitor for receiving an output signal from said input buffer; and
a second logic circuit for generating a signal for starting an operation of said first current source circuit in response to an output signal from said delay monitor.

24. The circuit according to claim 21, wherein said comparator comprises:
a first transfer gate which has an input terminal for receiving a charged voltage of said first capacitor, and is enabled when a control signal is in a first state;
a second transfer gate which has an input terminal for receiving a charged voltage of said second capacitor, and is enabled when the control signal is in a second state;
a capacitor, one terminal of which is connected to output terminals of said first and second transfer gates;
an inverter circuit, an input terminal of which is connected to the other terminal of said capacitor; and
a third transfer gate which is connected between the input terminal and an output terminal of said inverter circuit, and is enabled when the control signal is in the first state.

* * * * *